US006797986B1

(12) United States Patent
Kurahashi et al.

(10) Patent No.: US 6,797,986 B1
(45) Date of Patent: Sep. 28, 2004

(54) SEMICONDUCTOR LIGHT EMITTING ELEMENT

(75) Inventors: Takahisa Kurahashi, Kashiba (JP); Hiroshi Nakatsu, Tenri (JP); Hiroyuki Hosoba, Kyoto (JP); Tetsurou Murakami, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/607,965

(22) Filed: Jun. 30, 2000

(30) Foreign Application Priority Data

Aug. 24, 1999 (JP) .......................................... 11-236619

(51) Int. Cl.⁷ ............................ H01L 33/00; H01S 5/00
(52) U.S. Cl. ............................. 257/98; 257/94; 257/95; 257/96; 257/97; 372/45; 372/46
(58) Field of Search ............................. 257/94–99, 79, 257/83, 93, 103; 372/45, 46

(56) References Cited

U.S. PATENT DOCUMENTS

| 5,226,053 A | | 7/1993 | Cho et al. |
| 5,459,746 A | * | 10/1995 | Itaya et al. ................... 372/46 |
| 5,466,950 A | * | 11/1995 | Sugawara et al. ............ 257/94 |
| 5,821,569 A | * | 10/1998 | Dutta .......................... 257/96 |

FOREIGN PATENT DOCUMENTS

| JP | 3-229480 A | | 11/1991 |
| JP | 09-074221 | * | 3/1997 |
| JP | B2-2744503 | | 2/1998 |

OTHER PUBLICATIONS

High Brightness Visible (660 nm) Resonant–Cavity Light-Emitting Diode (IEEE Photonics Technology Letters, vol. 10, No. 12, Dec. 1998).

Streubel et al, "High Brightness Visible (660 nm) Resonant-Cavity Light–Emitting Diode", IEEE Photonics Technology Letters, vol. 10, No. 12, Dec. 1998, pp. 1685–1687.

U.S. patent application Ser. No. 09/645,571, filed Aug. 25, 2000, entitled "Semiconductor Light–Emitting Device and Method for Fabricating the Device".

* cited by examiner

Primary Examiner—Donghee Kang
(74) Attorney, Agent, or Firm—Nixon & Vanderhye, PC

(57) ABSTRACT

Is provided a resonant cavity type light emitting diode having excellent humidity durability and a light output unsaturated even several 10 mA., which is suitable for mass production. The semiconductor light emitting element has a resonator formed by one set of multi-layer reflecting films disposed at a constant distance on a GaAs substrate inclined at an angle of not less than 2 degrees in the direction [011] or [0-1-1] from the plane (100) and a light emitting layer disposed at a loop position of a standing wave in the resonator, wherein a multi-layer reflecting film disposed on the GaAs substrate side is composed of plural layers of $Al_xGa_{1-x}As$ (0 $\leq x \leq 1$) and a multi-layer reflecting film disposed on the opposite side of the GaAs substrate is composed of plural layers of $Al_yGa_zIn_{1-y-z}P$ ($0 \leq y \leq 1$, $0 \leq z \leq 1$), thereby achieving an improved humidity durability and an increased reflection factor by increasing the number of the reflection layers.

29 Claims, 12 Drawing Sheets

US 6,797,986 B1

SEMICONDUCTOR LIGHT EMITTING ELEMENT

BACKGROUND OF THE INVENTION

The present invention relates to a semiconductor light emitting element and, more specifically, to a resonant cavity type light emitting diode that possesses an excellent humidity durability and has light output unsaturated even at an injection current of not more than several 10 mA.

In recent years, semiconductor light emitting elements have widely used for optical communications and information semiconductor light emitting element information display panels. In this connection, concentrated development efforts have been placed on creating semiconductor light emitting elements having high efficiency of light emission and high-speed response in particular for optical communication. Conventional surface-emitting type light emitting diodes have insufficient response characteristics that are limited (LED) to 100 Mbps–200 Mbps. Accordingly, there have been developed new semiconductor light emitting elements so called resonant cavity type light emitting diodes (LED). The resonant cavity type LED is a semiconductor light emitting element which controls spontaneous light-emission by setting a light emitting layer at a loop (anti-node) of standing wave produced in a resonator composed of two mirrors, thus achieving high speed response and high efficiency of light emission. Prior arts are described in Japanese Patent Publication No. 2744503and U.S. Pat. No. 5,226,053. With advanced application of optical fibers made of plastic materials (POF) such as PMMA for relatively short distance communications, there has been developed a new resonant cavity type LED that has a light-emission layer made of a AlGaInP semiconductor capable of effectively emitting light with wavelengths of 650 nm, which corresponds to a low-loss frequency range of the POF. This type LED is disclosed in IEEE Photonics Technology Letters, Vol. 10, No. 12, December 1998 (High Brightness Visible Resonant Cavity Light Emitting Diode).

The conventional resonant cavity type LED uses multi-layer reflecting film of AlGaAs material as a mirror composing a resonator, so it has a layer of AlGaAs having a mixed AlAs or Al crystal ratio of about 1 in the neighborhood of its surface electrode, which may decrease its humidity durability. Since current injected from the surface is insufficiently diffused only by a distributed Bragg reflector (DBR) having thickness of about 1 $\mu$m, the light output of the LED is saturated even with injected current of several 10 mA. To compensate the above insufficiency, the surface electrode is made in the form of a honeycomb or meshed electrode of several micro-millimeters ($\mu$m) in width. However, this solution arose a new problem with breaking electrodes in the production process. The proposed element was not suited for mass-production.

SUMMARY OF INVENTION

An object of the present invention is to provide a resonant cavity type light emitting diode that has excellent humidity durability and a light output unsaturated even with several 10 mA and is suitable for mass production.

Another object of the present invention is to provide a semiconductor light emitting element having a resonator composed of paired multi-layer reflecting films disposed at a constant distance on a GaAs substrate and having a light emitting layer disposed at the loop position of a standing wave in the resonator, wherein relative to the light emitting layer, a multi-layer reflecting film disposed on the GaAs substrate side is composed of plural layers of $Al_xGa_{1-x}As$ ($0 \leq x \leq 1$) and a multi-layer reflecting film opposite to the GaAs substrate side is composed of plural layers of $Al_yGa_zIn_{1-y-z}P$ ($0 \leq y \leq 1$, $0 \leq z \leq 1$).

In the above semiconductor light emitting element, relative to the light emitting layer, a multi-layer reflecting film of $Al_xGa_{1-x}As$ ($0 \leq x \leq 1$), disposed on the GaAs substrate side, has a very small differential thermal expansion coefficient relative to the GaAs substrate. Consequently, the transition due to a difference of temperatures before and after crystal growth may not occur. This makes it possible for the element to easily obtain a high reflection factor by increasing the number of reflecting films.

Relative to the light emitting layer, the multi-layer reflecting film opposite to the GaAs substrate side reflecting film is formed of $Al_yGa_zIn_{1-y-z}P$ ($0 \leq y \leq 1$, $0 \leq z \leq 1$). This film has a maximum content of Al when matching the lattice of the GaAs substrate, which value is 25%, i.e., merely a half of 50% for $Al_xGa_{1-x}As$ ($0 \leq x \leq 1$). This can considerably improve the humidity durability of the element. For multi-layer reflecting film of $Al_yGa_zIn_{1-y-z}P$ ($0 \leq y \leq 1$, $0 \leq z \leq 1$), the transition is apt to occur due to a difference of thermal expansion coefficients between the film and the GaAs substrate when the number of layers exceeds 20–30 pairs. For the resonant cavity type light emitting diode, the multi-layer reflecting film opposite to the GaAs substrate side need not have a high reflection factor in comparison with the multi-layer reflecting film on the GaAs substrate side, so usually it need not have layers exceeding 20 pairs and may therefore be free from the occurrence of the transition.

Another object of the present invention is to provide a semiconductor light emitting element whose light emitting layer is composed of a single- or multi-layer film of $Al_yGa_zIn_{1-y-z}P$ ($0 \leq y \leq 1$, $0 \leq z \leq 1$).

The above semiconductor element can emit light with wavelengths of about 550 nm–680 nm from its light emitting layer of $Al_yGa_zP$ ($0 \leq y \leq 1$, $0 \leq z \leq 1$).

Another object of the present invention is to provide a semiconductor light emitting element in which a current constricting structure of an insulation layer or the same-conductive type layer as the GaAs substrate is disposed above the light emitting layer.

Owing to the current constricting structure formed by an insulation layer or the same-conduction type layer as the GaAs substrate above the light emitting layer, the semiconductor light emitting element can increase a current density, achieving high internal quantum efficiency. The absence of an electrode for a bonding pad on the light emitting portion improves the light emitting efficiency of the element. Furthermore, the use of the semiconductor light emitting element for optical communications realizes higher efficiency of coupling with optical fibers owing to a reduced size of its light emitting portion.

Another object of the present invention is to provide a semiconductor light emitting element having the current constricting structure formed by a layer of $Al_xGa_{1-x}As$ ($0 \leq x \leq 1$)

In the semiconductor light emitting element, the current constricting layer matching the lattice of the GaAs substrate can be formed through a crystal growth process.

Another object of the present invention is to provide a semiconductor light emitting element that has the current constricting structure formed by a layer of $Al_yGa_zIn_{1-y-z}P$ ($0 \leq y \leq 1$, $0 \leq z \leq 1$)

In this semiconductor light emitting element, the current constricting layer can be formed through the growth of crystals. The layer of $Al_yGa_zIn_{1-y-z}P$ ($0 \leq y \leq 1$, $0 \leq z \leq 1$) can become transparent (light-transmittable) to permit the passage of light with wavelengths of more than 550 nm, thus assuring effective emission of the light.

Another object of the present invention is to provide a semiconductor light emitting element that has a current diffusion layer formed above the layer forming the current constricting structure.

Owing to the presence of the current diffusion layer formed above the current constricting layer, the semiconductor light emitting element can uniformly emit light at a reduced operating voltage.

A further object of the present invention is to provide a semiconductor light emitting element that has the current diffusion layer formed by a layer of $Al_xGa_{1-x}As$ ($0 \leq x \leq 1$).

The semiconductor light emitting element can become transparent (light transmittable) to permit the passage of light emitted with wavelengths of more than 590 nm with due consideration of humidity durability. The element can thus emit the light at an increased efficiency.

A still further object of the present invention is to provide a semiconductor light emitting element that has the current diffusion layer formed by a layer of $Al_yGa_zIn_{1-y-z}P$ ($0 \leq y \leq 1$, $0 \leq z \leq 1$).

The semiconductor light emitting element becomes transparent (light transmittable) to permit the passage of light with wavelengths of more than 550 nm. Therefore, the element can effectively emit the light at an increased efficiency.

Another object of the present invention is to provide a semiconductor light emitting element that has the current diffusion layer formed by a transparent electrode having the transmittance of the emitted light, which transmittance is not less than 50%.

The semiconductor light emitting element containing the current diffusion layer formed by a light-transmitting electrode of transmittance of 50% or more can be operated at an operating voltage being lower than that of the semiconductor light emitting element having a current diffusion layer formed by semiconductor material.

Another object of the present invention is to provide a semiconductor light emitting element whose GaAs substrate has a surface inclined at an angle of not less than 2 degrees in the direction [011] or [0-1-1] from the plane (100).

The semiconductor light emitting element having the GaAs substrate inclined at an angle of not less than 2 degrees in the direction [011] or [0-1-1] from the plane (100) can achieve a high reflection efficiency of the multi-layer reflecting film that has the reduced number of layers since the reflecting film of $Al_yGa_zIn_{1-y-z}P$ ($0 \leq y \leq 1$, $0 \leq z \leq 1$) can be easily formed with a mirror surface disposed opposite to the GaAs substrate side reflecting film with the light emitting layer.

DETAILED DESCRIPTION OF THE PREFERRED EMBODIMENT

Preferred embodiments of the present invention will be described below with reference to FIGS. 1 to 12.

Embodiment 1

Figure 1A:
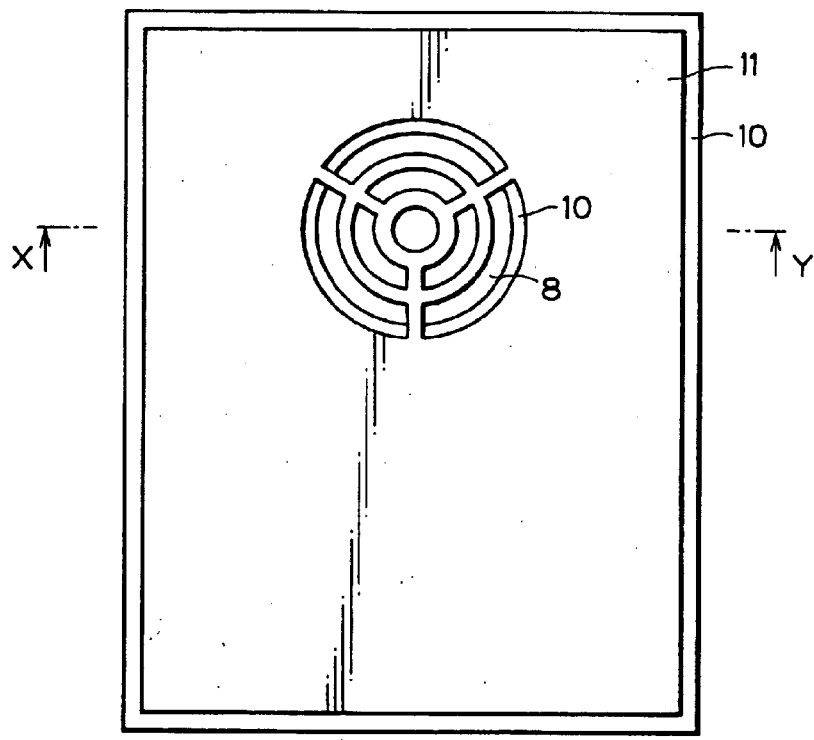
FIGS. 1A and 1B are a plan view and a sectional view taken on line X-Y of FIG. 1A, respectively, of a semiconductor light emitting element according to a first embodiment of the present invention.
Figure 1B:
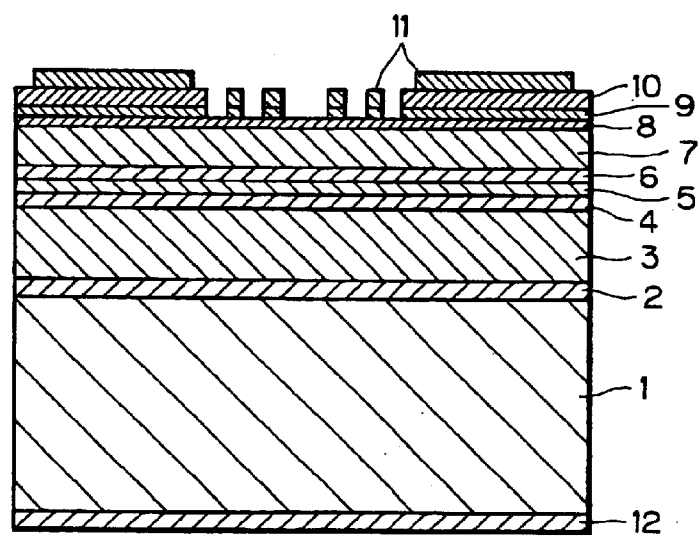

FIG. 1A shows in plan a semiconductor light emitting element that is a first embodiment of the present invention and FIG. 1B is a sectional view taken on line X-Y of FIG. 1A.

Figure 2:
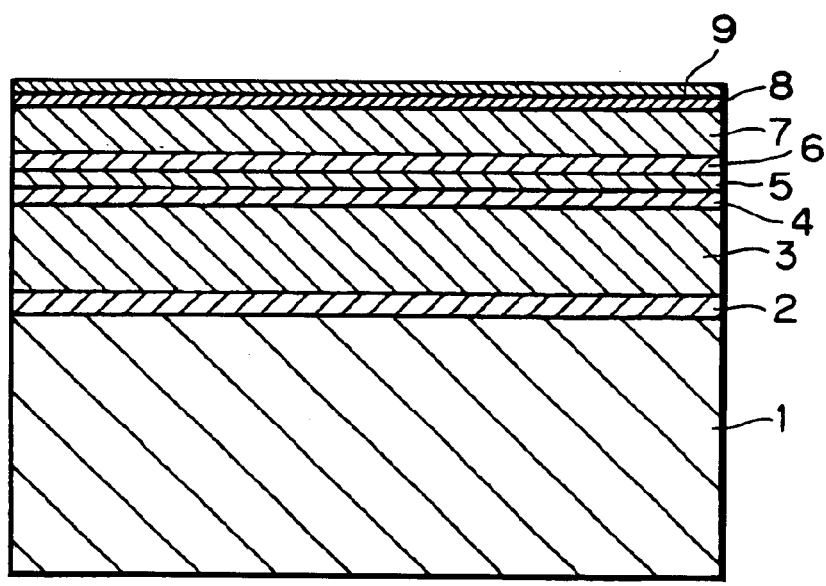
FIG. 2 is a sectional view of the semiconductor light emitting element shown in FIGS. 1A and 1B, which is midway through its manufacturing process.

FIG. 2 is a sectional view of the semiconductor light emitting element according to the first embodiment, which is midway through its manufacturing process.

Figure 3A:
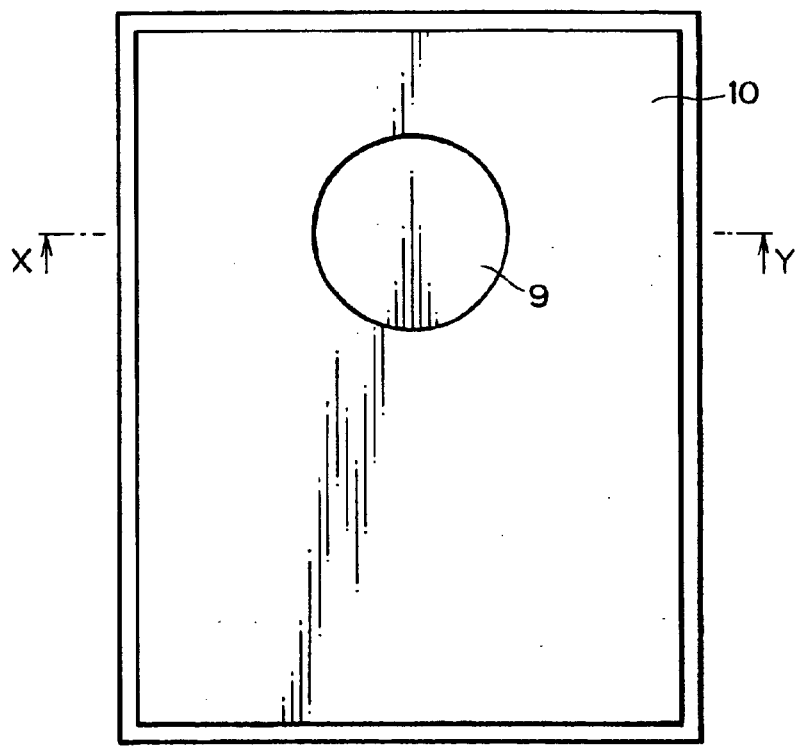
FIGS. 3A and 3B are a plan view and a sectional view taken on line X-Y of FIG. 3A, respectively, of the semiconductor light emitting element of FIGS. 1A and 1B, which is midway through its manufacturing process.
Figure 3B:
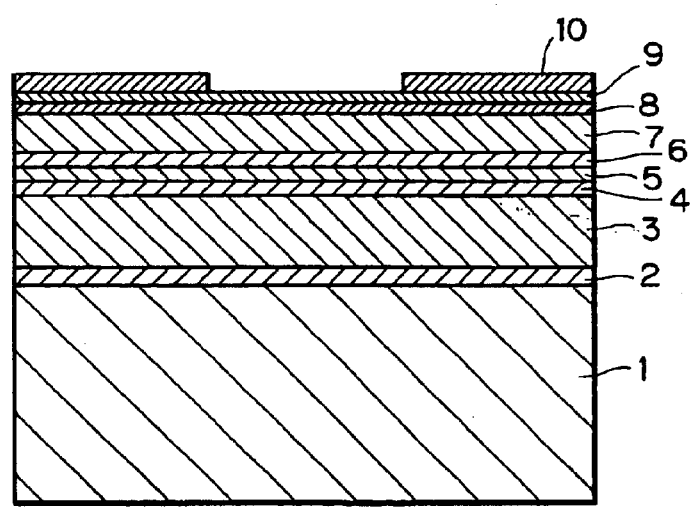

FIG. 3A is a plan view of a semiconductor light emitting element according to the first embodiment, which is midway through its manufacturing process. FIG. 3B is a sectional view taken on line X-Y of FIG. 3A.

The semiconductor light emitting element is of the AlGaInP group and has, as shown in FIG. 2, a n-type GaAs substrate 1 inclined at an angle of 2 degrees in the direction [011] or [0-1-1] from its plane (100) and has a series of layers deposited on the substrate 1 by an MOCVD (Metal Organic Chemical Vapor Deposition) method. Namely, an n-type GaAs buffer layer 2 (1 μm thick layer), a DBR (distributed bragg reflector) 3 consisting of 30 paired layers of n-type AlAs and n-type $Al_{0.5}Ga_{0.5}As$, a first clad layer 4 of n-type $(Al_{0.7}Ga_{0.3})_{0.5}In_{0.5}P$, a quantum well active layer 5 consisting of a well layer of GaInP and a barrier layer of $(Al_{0.5}Ga_{0.5})_{0.5}In_{0.5}P$, a second clad layer 6 of p-type $(Al_{0.7}Ga_{0.3})_{0.5}In_{0.5}P$, a DBR 7 consisting of 12 pairs of a p-type $(Al_{0.2}Ga_{0.8})_{0.5}In_{0.5}P$ layer and a p-type $Al_{0.5}In_{0.5}P$ layer, an intermediate layer 8 of p-type $(Al_{0.2}Ga_{0.8})_{0.5}In_{0.5}P$ (0.1 μm thick layer) and a contact layer 9 of p-type GaAs (1 μm thick layer) are deposited in subsequent layers in the described order on the GaAs substrate 1 by the MOCVD method.

The DBR 3 consisting of 30 pairs of an n-type AlAs and an n-type $Al_{0.5}Ga_{0.5}As$ layer and the DBR 7 consisting of 12 pairs of a p-type $(Al_{0.2}Ga_{0.8})_{0.5}In_{0.5}P$ layer and a p-type $Al_{0.5}In_{0.5}P$ layer are formed each to have a center reflection spectrum of 650 nm. A resonator formed by these DBR 3 and DBR 7 is adjusted in its length to have a resonant wavelength of 650 nm. In the embodiment 1, the length of the resonator is adjusted to 1.5 times the wavelength. Furthermore, the quantum well active layer 5 composing a light emitting layer Is positioned at a loop position of a standing wave produced in the resonator and adjusted to obtain a peak wavelength 650 nm of light to be emitted from there.

Then, as shown in FIGS. 3A and 3B, a $SiO_2$-film 10 is deposited on a wafer surface by the CVD method and a 70-μm diameter circular current channel is formed therein by photolithography and dilution HF etching.

Returning to FIGS. 1A and 1B, AnZu/Mo/Au is sputtered onto the p-type GaAs contact layer 9 and the $SiO_2$ film 10 layer and a surface electrode is formed thereon by photolithographic patterning. Conventionally, there is a 1–3 μm thick layer between the surface electrode 11 and the light emitting layer, wherein current is diffused Insufficiently. Accordingly, the shown embodiment has an electrode formed in the form of a ring having the width of several micro-millimeters (μm) as shown in FIG. 1A, through which current can be uniformly injected into the light emitting layer. Therefore, the occurrence of light that cannot be output by the presence of the electrode can be suppressed. A p-type electrode 11 is then formed by thermal treating. The GaAs substrate is ground at its open surface to its thickness of 280 μm, whereon AuGe/Au is deposited and thermally treated to form an n-type electrode 12 thereon.

The thus obtained semiconductor light emitting has a multi-layer reflecting film (DBR3) with a total film thickness of 3 μm on the side near to the GaAs substrate 1 but may be free from the occurrence of a camber or a dark line of the film owing to a small difference in thermal expansion coefficients of the film and the substrate 1. The film of 30 paired layers achieves an increased light reflection coefficient of 99%. Relative to the emitting layer consisting of the quantum well active layer 5, the multi-layer reflecting film (DBR7) disposed on the side opposite to the GaAs substrate 1 is formed of material AlGaInP and has surface layers of $Al_{0.5}In_{0.5}P$ with a maximal content of Al, which has a sufficient humidity durability. The multi-layer reflecting film shows a peak reflection factor of about 70%, which value is sufficient for the resonant cavity structure of the element. The semiconductor light emitting element was tested for operation with current 50 mA at an ambient temperature of 80° C. and relative humidity of 85%. The light output of the element was measured after 1000 hours of test duration and it achieved 90% of its initial output. The element has a current constricting structure formed by the $SiO_2$ film 10 and can therefore obtain a high internal quantization efficiency and a high external radiation efficiency. Namely, the useful initial light produced from the element achieved 1.6 mW at 20 mA, which is sufficient for use in the optical communications over plastic optical fiber (POF) networks.

Embodiment 2

Figure 4A:
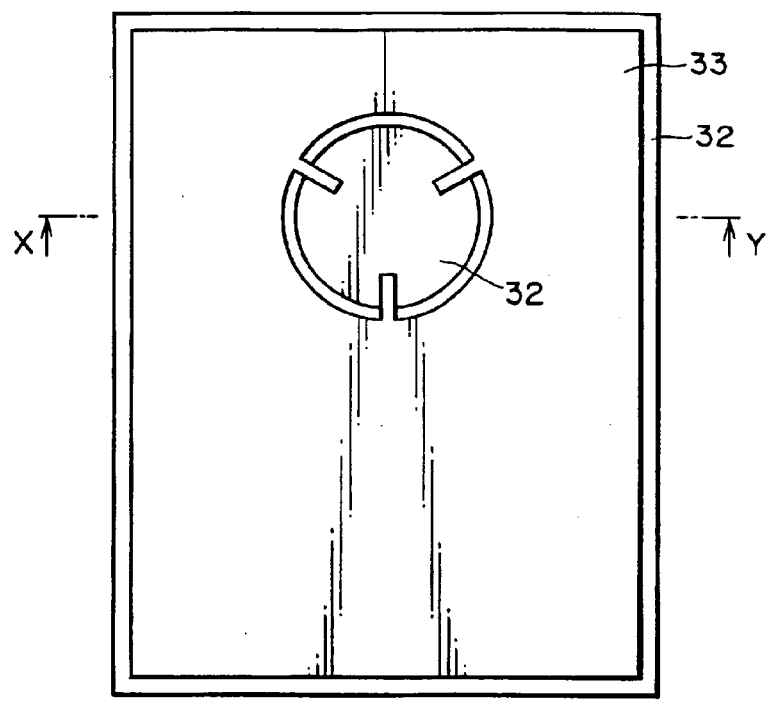
FIGS. 4A and 4B are a plan view and a sectional view taken on line X-Y of FIG. 4A, respectively, of a semiconductor light emitting element according to a second embodiment of the present invention.
Figure 4B:
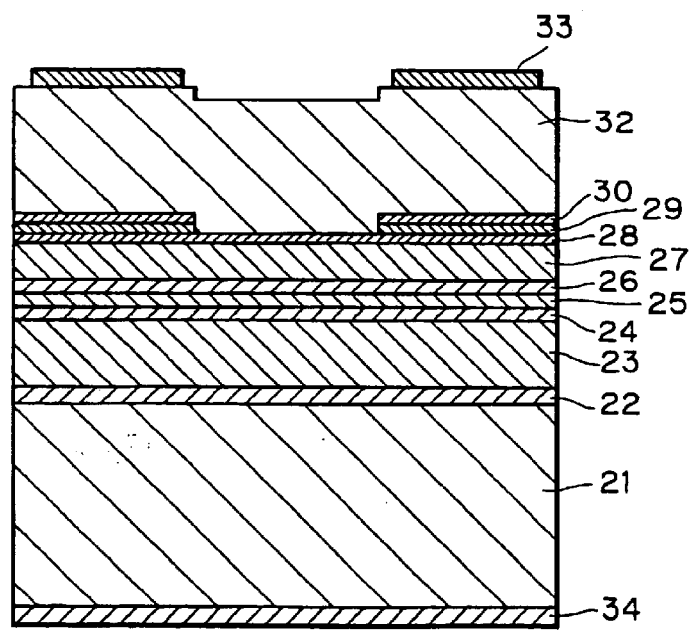

FIG. 4A is a plan view of a semiconductor light emitting element according to a second embodiment of the present invention and FIG. 4B is a sectional view taken on line X-Y of FIG. 4A.

Figure 5:
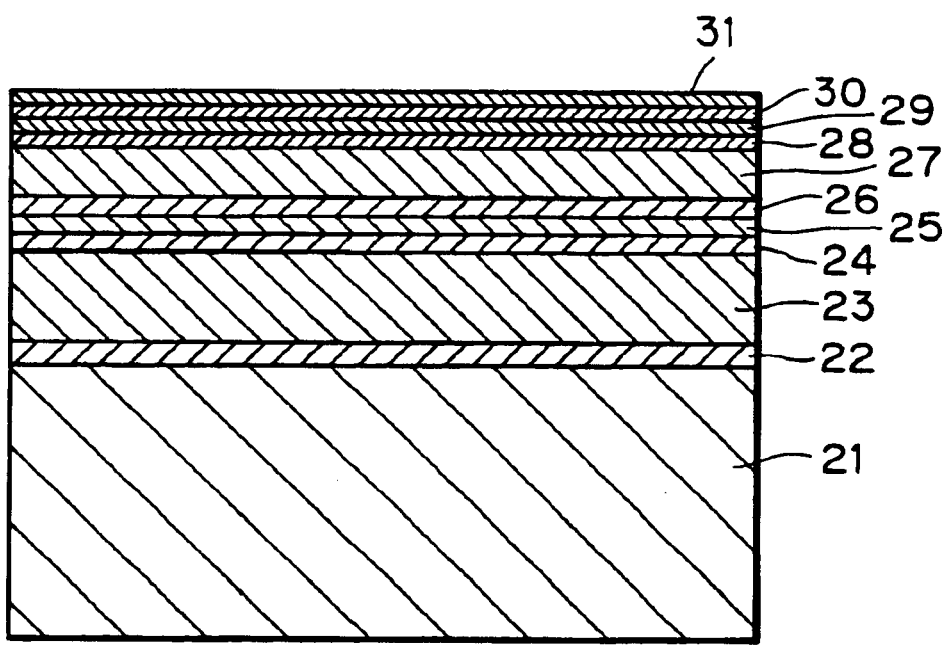
FIG. 5 is a sectional view of the semiconductor light emitting element shown in FIGS. 4A and 4B, which is midway through its manufacturing process.

FIG. 5 is a sectional view of the semiconductor light emitting element (embodiment 2) being midway through its manufacturing process.

Figure 6A:
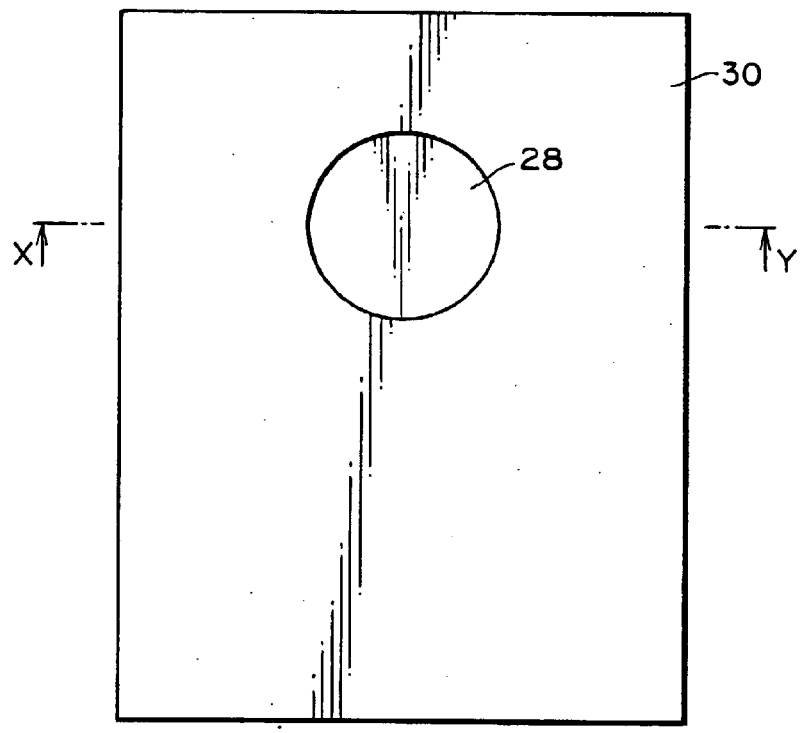
FIGS. 6A and 6B are a plan view and a sectional view taken on line X-Y of FIG. 6A, respectively, of the semiconductor light emitting element of FIGS. 4A and 4B, which is midway through its manufacturing process.
Figure 6B:
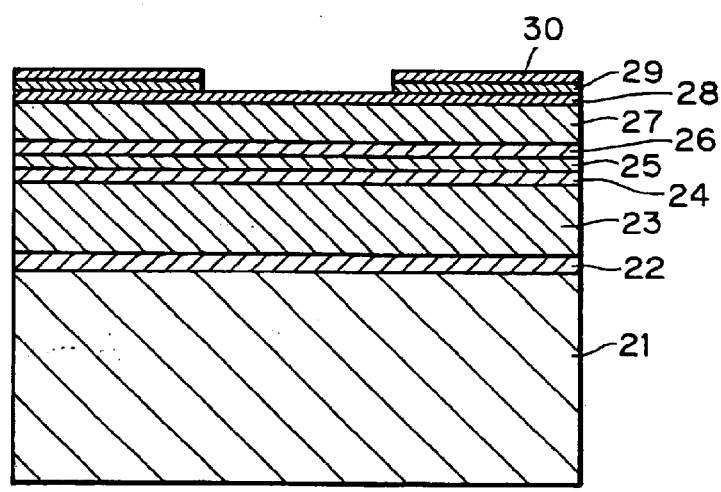

FIG. 6A is a plan view of the semiconductor light emitting element (embodiment 2) being midway through its manufacturing process, and FIG. 6B is a sectional view taken on line X-Y of FIG. 6A.

The shown semiconductor light emitting element is of the AlGaInP group and has, as shown in FIG. 5, a n-type GaAs substrate 21 inclined at an angle of 15 degrees in the direction [011] or [0-1-1] from the plane (100) and has layers subsequently deposited thereon by the MOCVD method. Namely, an n-type GaAs buffer layer 22 (1 μm thick layer), a DBR (distributed bragg reflector) 23 consisting of 30 paired layers of n-type AlAs and n-type $Al_{0.5}Ga_{0.5}As$, a first clad layer 24 of n-type $(Al_{0.7}Ga_{0.3})_{0.5}In_{0.5}P$, a quantum well active layer 25 consisting of a well layer of GaInP and a barrier layer of $(Al_{0.5}Ga_{0.5})_{0.5}In_{0.5}P$, a second clad layer 26 of p-type $(Al_{0.7}Ga_{0.3})_{0.5}In_{0.5}P$, a DBR 27 consisting of 12 pairs of a p-type $(Al_{0.2}Ga_{0.8})_{0.5}In_{0.5}P$ layer and a p-type $Al_{0.5}In_{0.5}P$ layer, an etching stop layer 28 of p-type $(Al_{0.2}Ga_{0.8})_{0.5}In_{0.5}P$ (0.5 μm thick layer), a current constricting layer 29 of n-type GaAs (0.3 μm thick layer), a protective layer 30 of n-type $(Al_{0.3}Ga_{0.7})_{0.5}In_{0.5}P$ (0.1 μm thick layer) and acap layer 31 of n-type GaAs (0.01 μm thick layer) are deposited in subsequent layers in the described order on the substrate 21 by the MOCVD method.

The DBR 23 consisting of 30 pairs of an n-type AlAs layer and an n-type $Al_{0.5}Ga_{0.5}As$ layer and the DBR 27 consisting of 12 pairs of a p-type $(Al_{0.2}Ga_{0.8})_{0.5}In_{0.5}P$ layer and a p-type $Al_{0.5}In_{0.5}P$ layer are formed each to have a center reflection spectrum of 650 nm. A resonator formed by these two DBRs 23 and 27 is adjusted in its length to have a resonant wavelength of 650 nm. In the embodiment 2, the length of the resonator is adjusted to 1.5 times the wavelength. Furthermore, the quantum well active layer 25 composing a light emitting layer is disposed at a loop position of a standing wave produced in the resonator and adjusted to obtain a peak wavelength 650 nm of light to be emitted from there.

Then, as shown in FIGS. 6A and 6B, the cap layer 31 is removed with a sulfuric acid/hydrogen peroxide etchant and the n-type $(Al_{0.3}Ga_{0.7})_{0.5}In_{0.5}P$ protective layer 30 and the n-type GaAs current constricting layer 29 are etched by photo-lithographically etching and by phosphoric acid and sulfuric acid/hydrogen peroxide etchant until it reaches the etching stop layer 28. A circular current passage having a diameter of 70 μm is thus formed.

Returning to FIGS. 4A and 4B, the p-type $Al_{0.5}Ga_{0.5}As$ current diffusion layer 32 (7 μm thick) is grown again on the n-type $(Al_{0.3}Ga_{0.7})_{0.5}In_{0.5}P$ protective layer 30 and the p-type $(Al_{0.2}Ga_{0.8})_{0.5}In_{0.5}P$ etching stop layer 28, then AnZu/Mo/Au is sputtered onto the p-type $Al_{0.5}Ga_{0.5}As$ current diffusion layer 32 and a surface electrode is formed by photo-lithographically etching and etching with an Au-etchant and an ammonia/hydrogen peroxide etchant. A p-type electrode 33 is obtained by thermal treatment. The GaAs substrate is ground at its surface to the thickness of about 280 μm, then metal AuGe/Au is deposited to the ground surface of the substrate and thermally treated to form thereon an n-type electrode 34.

The semiconductor light emitting element thus produced has the multl-layer reflecting film similar in structure to that of the embodiment 1 but uses the GaAs substrate inclined at an angle of 15 degrees in the direction [011] from the plane (100) while the GaAs substrate of the embodiment 1 is inclined at an angle of 2 degrees in the same direction. Namely, the embodiment 2 can obtain higher surface quality of the substrate. Consequently, the reflection factor of the multi-layer reflecting film (DBR27) made of AlGaInP group material, which is opposite to the GaAs substrate side reflecting film (DBR 21) with the light emitting layer between them, achieves an improved reflection factor of 75% as compared with the reflection factor (70%) of the equivalent film of embodiment 1. The element of the embodiment 2 has sufficient humidity durability. The semiconductor light emitting element according to the embodiment 2 was tested for operation with current of 50 mA at an ambient temperature of 80° C. and humidity of 85% and its light outputafter 1000 hours of the test duration was measured. The measured light output corresponds to 90% of Iits initial light output. The element also achieved a sufficient initial light output of 2.2 mW at 20 mA. Owing to the current diffusion surface layer 32 of $Al_{0.5}Ga_{0.5}As$, the semiconductor light emitting element of the embodiment 2 can increase its light output to 4.2 mW in proportion to its operating current increasing to 40 mA while the semiconductor light emitting element of the embodiment 1 shows a somewhat saturated output of 2 mW with the operating current increasing to 40 mA. The embodiment 2 also achieved a reduced operating voltage of 2.1 V with a current of 20 mA as compared with the operating voltage of 2.2 V of the embodiment 1 with the same current. All the above-described improvements have been obtained by the effect of the $Al_{0.5}Ga_{0.5}As$ current diffusion layer 32 allowing the current to uniformly be injected into the light emitting layer.

Embodiment 3

Figure 7A:
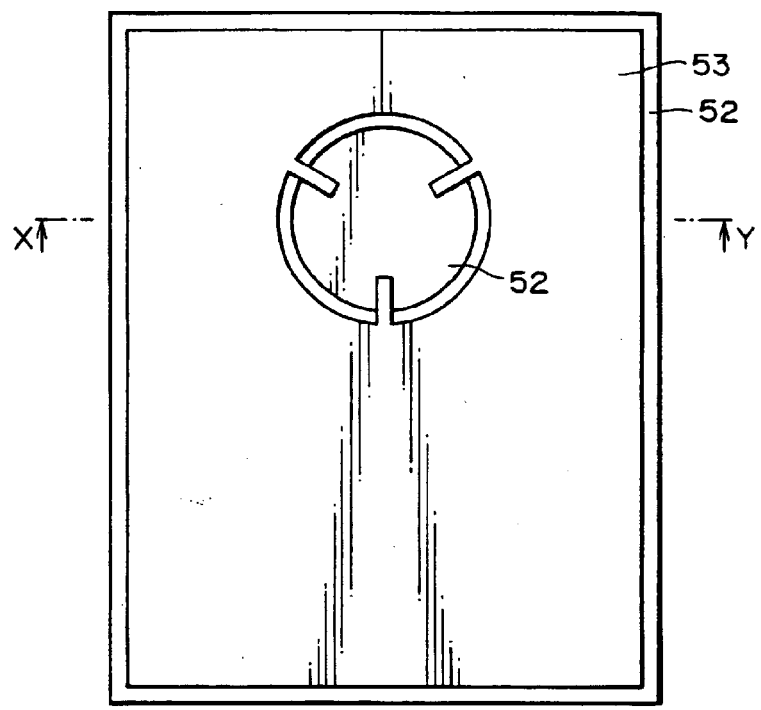
FIGS. 7A and 7B are a plan view and a sectional view taken on line X-Y of FIG. 7A, respectively, of a semiconductor light emitting element according to a third embodiment of the present invention.
Figure 7B:
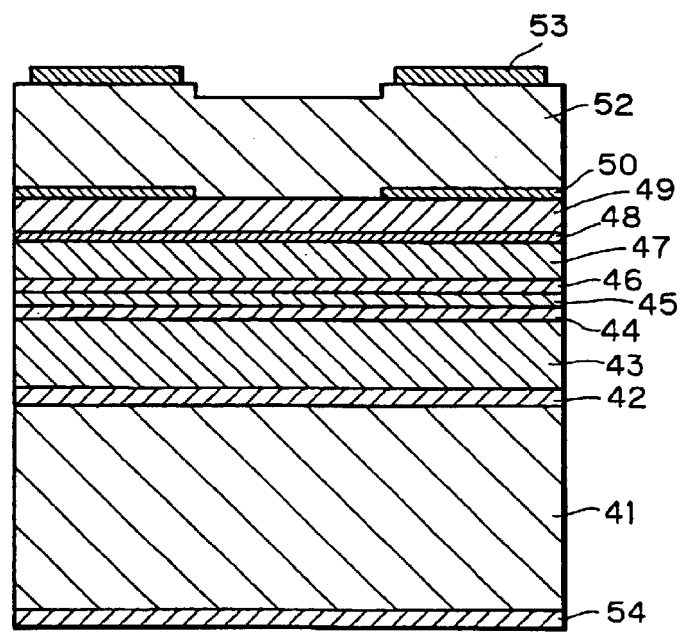

FIG. 7A is a plan view, respectively, of a semiconductor light emitting element according to a third embodiment of the present invention, and FIG. 7B is a sectional view taken on line X-Y of FIG. 7A.

Figure 8:
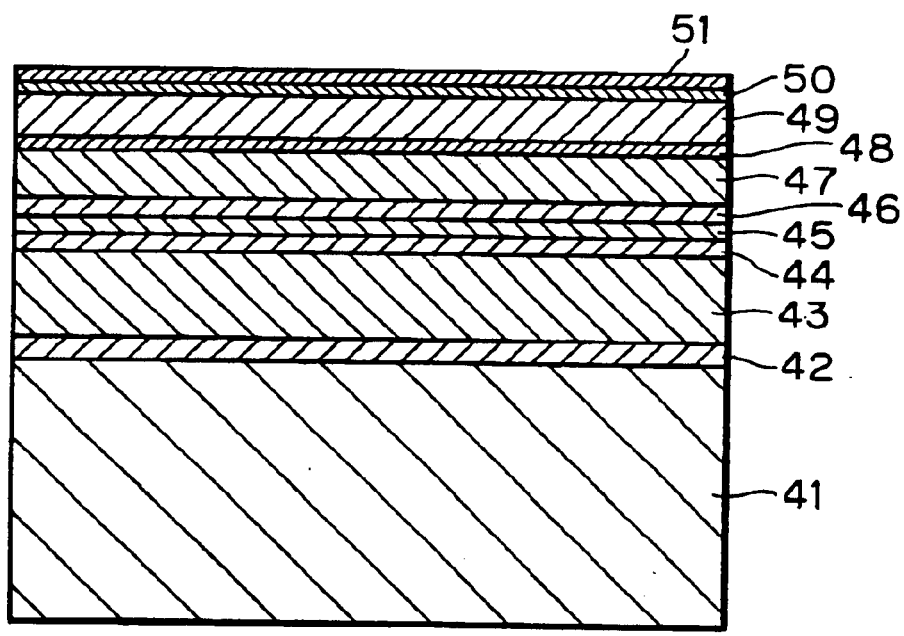
FIG. 8 is a sectional view of the semiconductor light emitting element shown in FIGS. 7A and 7B, which is midway through its manufacturing process.

FIG. 8 is a sectional view of the semiconductor light emitting element (embodiment 3) being midway through its manufacturing process.

Figure 9A:
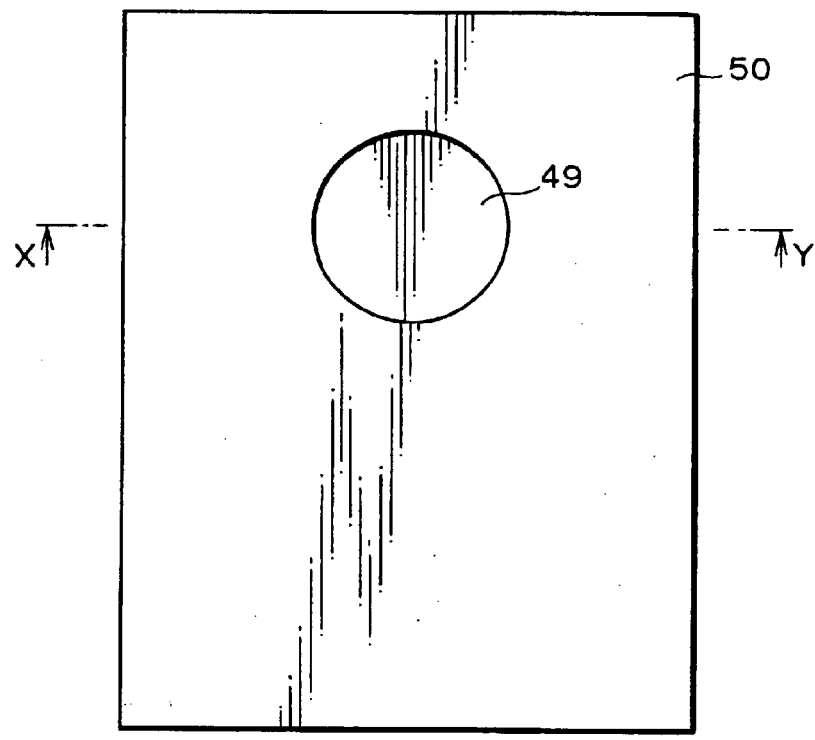
FIGS. 9A and 9B are a plan view and a sectional view taken on line X-Y of FIG. 9A, respectively, of the semiconductor light emitting element of FIGS. 7A and 7B, which is midway through its manufacturing process.

FIG. 9A is a plan view of the semiconductor light emitting element (embodiment 3) being midway through its manufacturing process, and FIG. 9A is a sectional view taken on line X-Y of FIG. 9A.

The shown semiconductor light emitting element is of the AlGaInP group and has, as shown in FIG. 8, a n-type GaAs substrate 41 inclined at an angle of 15 degrees in the direction [011] or [0-1-1] from the plane (100) andhas aseries of layers deposited thereon by the MOCVD method. Namely, an n-type GaAs buffer layer 42 (1 $\mu$m thick layer), a DBR (distributed bragg reflector) 43 consisting of 70 paired layers of n-type AlAs and n-type $Al_{0.7}Ga_{0.3}As$, a first clad layer 44 of n-type $(Al_{0.7}Ga_{0.3})_{0.3}In_{0.5}P$, a quantum well active layer 45 consisting of a well layer of $(Al_{0.3}Ga_{0.7})_{0.5}In_{0.5}P$ and a barrier layer of $(Al_{0.5}Ga_{0.5})_{0.5}In_{0.5}P$, a second clad layer 46 of p-type $(Al_{0.5}Ga_{0.5})_{0.5}In_{0.5}P$, a DBR 47 consisting of 18 pairs of a p-type $(Al_{0.4}Ga_{0.6})_{0.5}In_{0.5}P$ layer and a p-type $Al_{0.5}In_{0.5}P$ layer, an intermediate layer 48 ofp-type AlGaInP (0.15 $\mu$m thick layer), afirst currentdiffusion layer 49 of p-type AlGaInP (1 $\mu$m thick layer), a current constricting layer 50 of n-type AlGaInP (0.3 $\mu$m thick layer) and a cap layer 51 of n-type GaAs (0.01 $\mu$m thick layer) are deposited in subsequent layers in the described order on the substrate 41 by the MOCVD method. The DBR 43 consisting of 70 pairs of an n-type AlAs layer and an n-type $Al_{0.7}Ga_{0.3}As$ layer and the DBR 47 consisting of 18 pairs of a p-type $(Al_{0.4}Ga_{0.6})_{0.5}In_{0.5}P$ layer and a p-type $Al_{0.5}In_{0.5}P$ layer are formed each to have a center reflection J spectrum of 570 nm. A resonator formed by these two DBRs 43 and 47 is adjusted in its length to have a resonant wavelength of 570 nm. In the embodiment 3, the length of the resonator is adjusted to 1.5 times the wavelength. Furthermore, the quantum well active layer 45 is disposed at a loop position of a standing wave produced in the resonator and adjusted to obtain a peak wavelength 570 nm of light to be emitted from there.

Figure 9B:
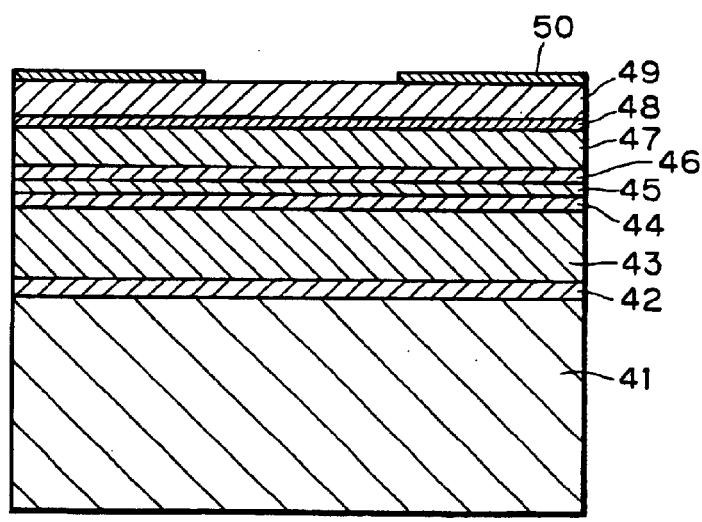

Then, as shown in FIGS. 9A and 9B, the n-type GaAs cap layer 51 is removed with a sulfuric acid/hydrogen peroxide etchant and the n-type AlGaInP current constricting layer 50 is etched by photo-lithographically etching and by a sulfuric acid/hydrogen peroxide etchant until it reaches the p-type AlGaInP first current diffusion layer 49. A circular current passage having a diameter of 70 $\mu$m is thus formed.

Returning to FIGS. 7A and 7B, the second p-type AlGaInP current diffusion layer 52 (7 $\mu$m thick) is grown again on the p-type AlGaInP current constricting layer 50 and the first p-type AlGaInP current diffusion layer 49.

A metal coat of AuBe/Au is deposited onto the second p-type AlGaInP current diffusion layer and a surface electrode is photo-lithographically patterned thereon and etched with an Au-etchant. A p-type electrode 53 is obtained by further thermal treatment. The GaAs substrate is ground at its surface to the thickness of about 280 $\mu$m, then AuGe/Au is deposited onto the ground surface of the substrate and thermally treated to form thereon an n-type electrode 54.

The semiconductor light emitting element thus produced has the AlGaAs multi-layer reflecting film (DBR43) (on the GaAs substrate side), which total thickness is about 7 $\mu$m and greater than those of the embodiments 1 and 2. However, the layer has a very small difference in thermal expansion from the substrate and therefore does not cause a camber of the substrate and a dark line thereon. The film composed of 70 pairs of layers realizes an improved reflection factor of 99% or more. The multi-layer reflecting film (DBR 47), which is disposed opposite to GaAs substrate side 41, is made of AlGaInP-material possessing sufficient humidity durability like the embodiments 1 and 2.

The semiconductor light emitting element according to the embodiment 3 was tested for operation with current of 50 mA at an ambient temperature of 8° C. and humidity of 85% and its light output after 1000 hours of the test duration was measured. The measured light output corresponds to 105% of its initial light output (0.4 mW).

Embodiment 4

Figure 10A:
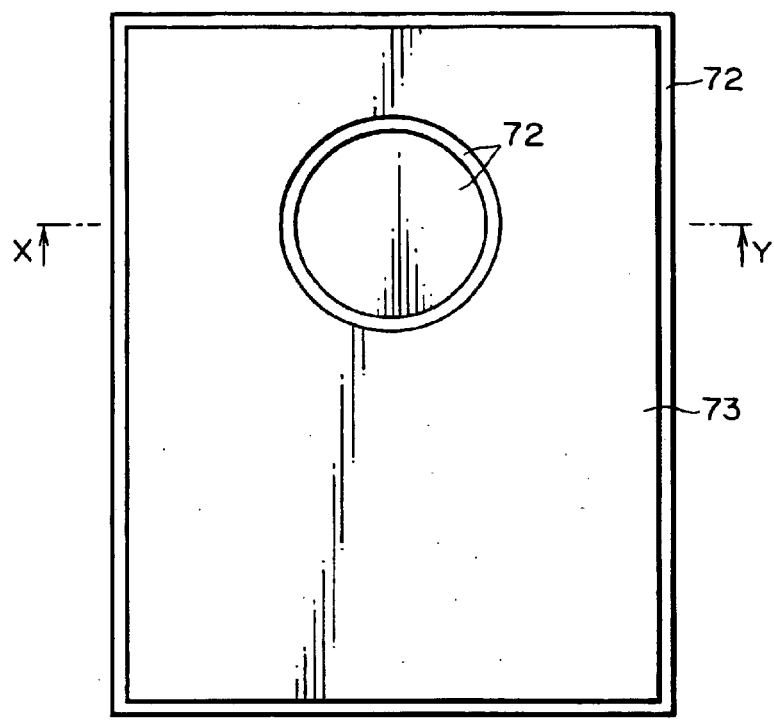
FIGS. 10A and 10B are a plan view and a sectional view taken on line X-Y of FIG. 10A, respectively, of a semiconductor light emitting element according to a fourth embodiment of the present invention.
Figure 10B:
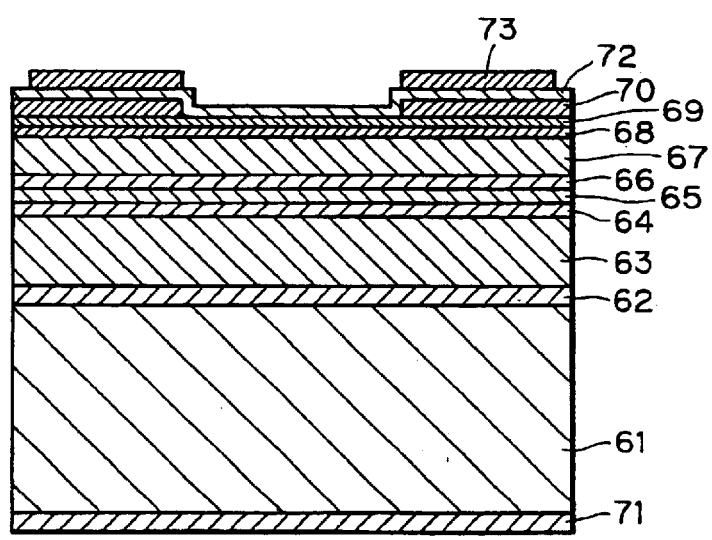

FIG. 10A is a plan view of a semiconductor light emitting element according to a fourth embodiment of the present invention and FIG. 10B is a sectional view taken on line X-Y of FIG. 10A.

Figure 11:
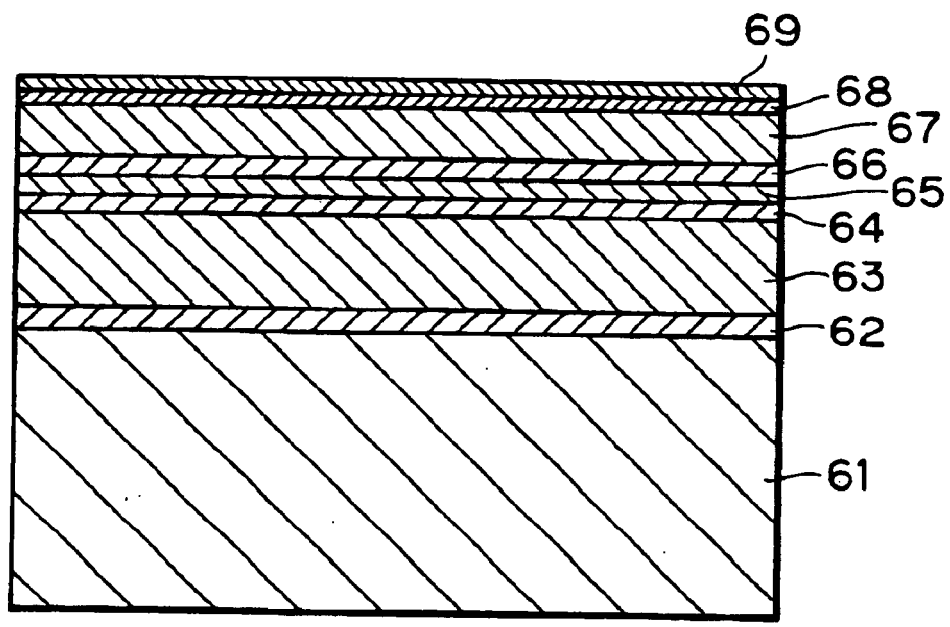
FIG. 11 is a sectional view of the semiconductor light emitting element shown in FIGS. 10A and 10B, which is midway through its manufacturing process.

FIG. 11 is a sectional view of the semiconductor light emitting element (embodiment 4) being midway through its manufacturing process.

Figure 12A:
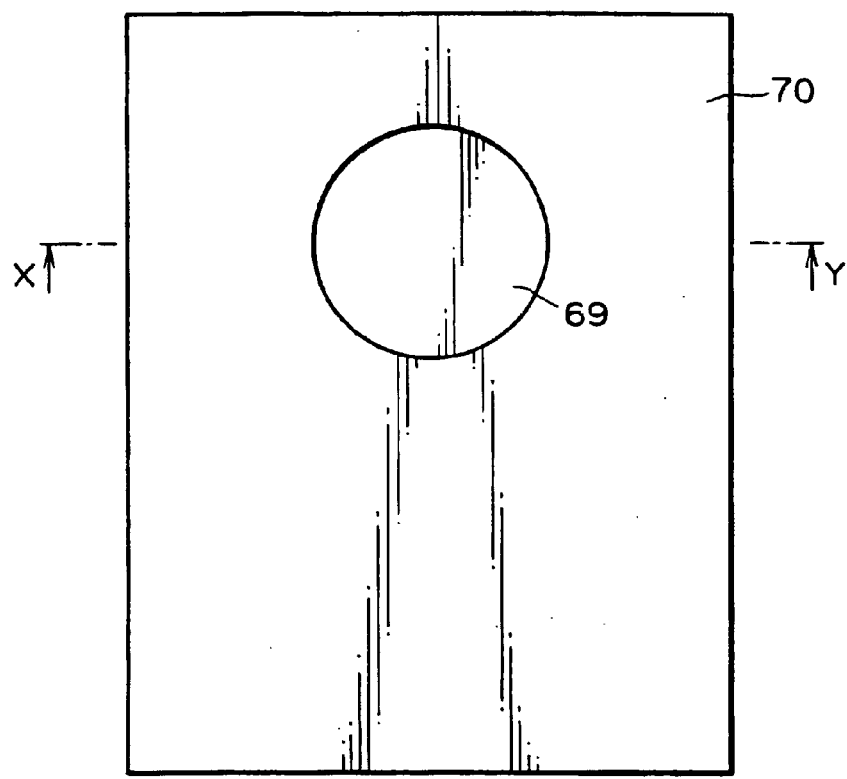
FIGS. 12A and 12B are a plan view and a sectional view taken on line X-Y of FIG. 12A, respectively, of the semiconductor light emitting element of FIGS. 10A and 10B, which is midway through its manufacturing process.
Figure 12B:
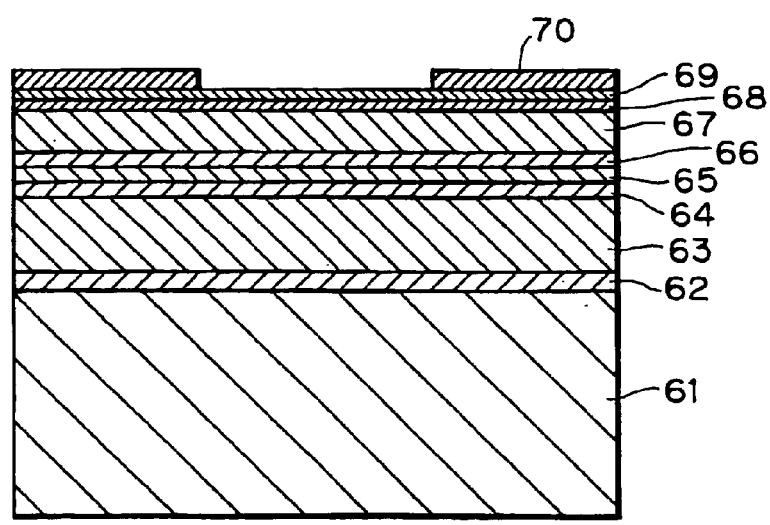

FIG. 12A is a plan view of the semiconductor light emitting element (embodiment 4) being midway through its manufacturing process, and FIG. 12B is a sectional view taken on line X-Y of FIG. 12A.

The shown semiconductor light emitting element is of the AlGaInP group and has, as shown in FIG. 11, a n-type GaAs substrate 61 inclined at an angle of 15 degrees in the direction [011] or [0-1-1] from the plane (100) has a series of layers deposited thereon by the MOCVD method. That is, an n-type GaAs buffer layer 62 (1 μm thick layer), a DBR (distributed bragg reflector) 63 consisting of 30 paired layers of n-type AlAs and n-type $Al_{0.5}Ga_{0.5}As$, a first clad layer 64 of n-type $(Al_{0.7}Ga_{0.3})_{0.5}In_{0.5}P$, a quantum well active layer 65 consisting of a well layer of GaInP and a barrier layer of $(Al_{0.5}Ga_{0.5})_{0.5}In_{0.5}P$, a second clad layer 66 of p-type $(Al_{0.7}Ga_{0.3})_{0.5}In_{0.5}P$, a DBR 67 consisting of 12 pairs of a p-type $(Al_{0.2}Ga_{0.8})_{0.5}In_{0.5}P$ layer and a p-type $Al_{0.5}In_{0.5}P$ layer, an intermediate layer 68 of p-type $(Al_{0.2}Ga_{0.8})_{0.5}In_{0.5}P$ (0.1μm thick layer) and a contact layer 69 of p-type GaAs (0.005 μm thick layer) are subsequently deposited in layers in the described order on the substrate 61 by the MOCVD method.

The DBR 63 consisting of 30 pairs of an n-type AlAs layer and an n-type $Al_{0.5}Ga_{0.5}As$ layer and the DBR 67 consisting of 12 pairs of a p-type $(Al_{0.2}Ga_{0.8})_{0.5}In_{0.5}P$ layer and a p-type $Al_{0.5}In_{0.5}P$ layer are formed each to have a center reflection spectrum of 650 nm. A resonator formed by these two DBRs 63 and 67 is adjusted in its length to have a resonant wavelength of 650 nm. Furthermore, the quantum well active layer 65 is disposed at a loop position of a standing wave produced in the resonator and adjusted to obtain a peak wavelength 650 nm of light to be emitted from there.

Then, as shown in FIGS. 12A and 12B, a $SiO_2$-film 70 is formed on a wafer surface by the CVD method and a circular current channel of 70 μm in diameter is formed therein by photolithography and etching with diluted HF. Namely, the $SiO_2$-film 70 forms a current constricting structure. Returning to FIGS. 10A and 10B, the GaAs substrate 61 is ground at its surface to the thickness of about 280 μm, then metal AuGe/Au is deposited onto the ground surface of the substrate to form thereon an n-type electrode 71. A surface electrode is formed by an ITO film 72 on the P-type GaAs contact layer 69 and the SiO2 film 70. Namely, the ITO film 72 serves as a current diffusion layer. A bonding pad 73 of Ti/Au is then formed thereon.

The semiconductor light emitting element thus produced has the same structure of the multi-layer reflecting films as those of the embodiment 2 but achieved a decreased operating voltage of 1.9V at 20 mA, which is lower than by 0.2V the operating voltage 2.1V of the embodiment 2. The p-type GaAs contact layer 69 and the ITO film 72 have a 70%-transmission coefficient of light with wavelengths of 650 nm. The measured light output of the semiconductor light emitting element according to the embodiment 4 is 1.5 mW at 20 mA. The light output of the element tested for operation at 50 mA for 1000 hours at an ambient temperature of 80° C. and humidity of 85% is 90% of the initial output. The test result shows the element possesses the sufficient humidity durability.

As is apparent from the foregoing, the semiconductor light emitting element according to the present invention has a resonator composed of one set of multi-layer reflecting films disposed at a constant distance on a GaAs substrate and has a light emitting layer disposed at a position of a standing-wave loop in the resonator for emitting light in the direction perpendicular to the substrate, wherein a multi-layer reflecting film disposed on the one side of the light emitting layer from the GaAs substrate side is composed of plural layers of $Al_xGa_{1-x}As$ ($0 \leq x \leq 1$) and a multi-layer reflecting film on the opposite side of the light emitting layer is composed of plural layers of $Al_yGa_zIn_{1-y-z}P$ ($0y \leq 1$, $0 \leq z \leq 1$).

In the above semiconductor light emitting element, relative to the light emitting layer, a multi-layer reflecting film of $Al_xGa_{1-x}As$ ($0 \leq x \leq 1$), disposed on the GaAs substrate side, has a very small differential thermal expansion coefficient relative to the GaAs substrate. Consequently, the transition due to a difference of temperatures before and after crystal growth may not occur. This makes it possible for the element to easily obtain a high reflection factor by increasing the number of reflecting films.

Since the multi-layer reflecting film disposed opposite to the the GaAs substrate side multi-layer reflecting film with the light emitting layer between them is formed of $Al_yGa_zIn_{1-y-z}P$ ($0 \leq y \leq 1.0 \leq z \leq 1$), it may have a maximum content of Al when matching the lattice with the GaAs substrate, which value is 25%, i.e., merely a half of 50% for $Al_xGa_{1-x}As$ ($0 \leq x \leq 1$). This can considerably improve the humidity durability of the element. For the multi-layer reflecting film of $Al_yGa_zIn_{1-y-z}P$ ($0 \leq y \leq 1,0 \leq z \leq 1$), the transition is apt to occur due to a difference of thermal expansion coefficients between the film and the GaAs substrate when the number of layers exceeds 20–30 pairs. For the resonant cavity type light emitting diode (LED), the multi-layer reflecting film on the opposite side need not have a high reflection factor in comparison with the multi-layer reflecting film on the GaAs substrate side, so usually it need not have layers exceeding 20 pairs and may therefore be free from the occurrence of the transition.

A semiconductor light emitting element according to an aspect of the present invention has a light emitting layer formed at the loop position of the standing-wave in the resonant cavity formed by a pair of multi-layer reflecting films disposed at a constant distance on the GaAs substrate, which light emitting layer is composed of a single- or multi-layer film of $Al_yGa_zIn_{1-y-z}P$ ($0 \leq y \leq 1$, $0 \leq z1$) and can emit light with wavelengths of 550 nm–680 nm.

A semiconductor light emitting element according to another aspect of the present invention has an insulation layer or a current constricting structure formed by a layer having the same conduction as the GaAs substrate, which layer is disposed above the light emitting layer. Owing to the above current constricting structure above the light emitting layer, the semiconductor light emitting element can increase a current density, achieving high internal quantum efficiency. The absence of an electrode for a bonding pad above the light emitting portion improves the light emitting efficiency of the semiconductor light emitting element. Furthermore, the use of the semiconductor light emitting element for optical communications realizes a high efficiency of coupling with optical fibers owing to a reduced size of its light emitting portion.

A semiconductor light emitting element according to another aspect of the present invention has a current constricting structure formed by a layer of $Al_xGa_{1-x}As$ ($0 \leq x \leq 1$) above the light emitting layer. This current constricting layer is of the same conduction type as the GaAs substrate and can therefore be formed matching the lattice with that of the GaAs substrate through the crystal growing process.

A semiconductor light emitting element according to another aspect of the present invention has the current constricting structure formed by a layer of $Al_yGa_zIn_{1-y-z}P$ ($0 \leq y \leq 1$, $0 \leq z \leq 1$). This current constricting layer is of the same conduction type as the GaAs substrate. This semiconductor light emitting element can form a current constricting layer matching the lattice of the GaAs substrate through the growth of crystals. The layer of $Al_yGa_zIn_{1-y-z}P$ ($0 \leq y \leq 1$, $0z \leq 1$) can become transparent to permit the passage of light with wavelengths of not more than 550 nm, assuring effective emission of the light.

A semiconductor light emitting element according to another aspect of the present invention has a current diffusion layer formed above the layer forming the current constricting structure formed by an insulation layer or the same-conductive type layer as the GaAs substrate above the light emitting layer. Owing to the presence of the current diffusion layer formed above the current constricting structure, the semiconductor light emitting element can uniformly emit light at a reduced operating voltage.

A semiconductor light emitting element according to another aspect of the present invention has the current diffusion layer formed by a layer of $Al_xGa_{1-x}As$ ($0 \leq x \leq 1$) above the layer forming the current constricting structure formed by an insulation layer or the same-conductive type layer as the GaAs substrate above the light emitting layer. The current diffusion layer of $Al_xGa_{1-x}As$ ($0 \leq x \leq 1$) can become transparent (light-transmittable) to permit the passage of light emitted with wavelength of more than 590 nm with due consideration of humidity durability. The element can thus emit the light at an increased efficiency.

A semiconductor light emitting element according to another aspect of the present invention has the current diffusion layer formed by a layer of $Al_yGa_zIn_{1-y-z}P$ ($0 \leq y \leq 1$, $0 \leq z \leq 1$). This current diffusion layer is above the layer forming the current constricting structure formed by an insulation layer or the same-conductive type layer as the GaAs substrate above the light emitting layer. The semiconductor light emitting element becomes transparent to permit the passage of light with wavelengths of more than 550 nm. Therefore, the element can effectively output the light produced with the wavelength of 550 nm.

A semiconductor light emitting element according to another aspect of the present invention has the current diffusion layer formed by a transparent (light-transmittable) electrode having the transmittance of not less than 50% of the emitted light. This current diffusion layer is above the layer forming the current constricting structure formed by an insulation layer or the same-conductive type layer as the GaAs substrate above the light emitting layer. The semiconductor light emitting element containing the current diffusion layer formed by a light-transmitting electrode of transmittance of 50% or more can be operated at a reduced operating voltage lower than that of the semiconductor light emitting element having a current diffusion layer formed by semiconductor material.

A semiconductor light emitting element according to another aspect of the present invention has the GaAs substrate has a surface inclined at an angle of not less than 2 degrees in the Idirection [011] or [0-1-1] from the plane (100) and can therefore achieve a high reflection efficiency of the multi-layer reflecting film disposed opposite to the GaAs substrate side, which reflecting film can have at the same time a saved number of layers since the reflecting film of $Al_yGa_zIn_{1-y-z}P$ ($0 \leq y \leq 1$, $0 \leq z \leq 1$) can be easily formed with amirror surface.

What is claimed is:

1. A semiconductor light emitting element having a resonator composed of paired multi-layer reflecting films disposed at a constant distance on a GaAs substrate and having a light emitting layer disposed at a loop position of a standing wave in the resonator, wherein a multi-layer reflecting film on the GaAs substrate side of the light emitting layer comprises plural layers of $Al_xGa_{1-x}As$ ($0 \leq x \leq 1$) and a multi-layer reflecting film on the other side of the light emitting layer comprises plural layers of $Al_yGa_zIn_{1-y-z}P$ ($0 \leq y \leq 1$, $0 \leq z \leq 1$).

2. A semiconductor light emitting element as defined in claim 1, wherein the light emitting layer comprises a single- or multi-layer film of $Al_yGa_zIn_{1-y-z}P$ ($0 \leq y \leq 1$, $0 \leq z \leq 1$).

3. A semiconductor light emitting element as defined in claim 1 or 2, wherein a current constricting structure of an insulation layer is disposed above the light emitting layer.

4. A semiconductor light emitting element as defined in claim 3, wherein a current diffusion layer is formed above the layer forming the current constricting structure.

5. A semiconductor light emitting element as defined in claim 4, wherein the current diffusion layer is formed by a transparent electrode having the transmittance of the emitted light, which transmittance is not less than 50%.

6. A semiconductor light emitting element as defined in claim 1 or 2, wherein a current constricting structure of the same conductive type as the GaAs substrate is disposed above the light emitting layer.

7. A semiconductor light emitting element as defined in claim 6, wherein the current constricting structure is formed by a layer of $Al_xGa_{1-x}As$ ($0 \leq x \leq 1$).

8. A semiconductor light emitting element as defined in claim 7, wherein a current diffusion layer is formed by a layer of $Al_xGa_{1-x}As$ ($0 \leq x \leq 1$).

9. A semiconductor light emitting element as defined in claim 7, wherein a current diffusion layer is formed above the layer forming the current constricting structure.

10. A semiconductor light emitting element as defined in claim 9, wherein the current diffusion layer is formed by a layer of $Al_yGa_zIn_{1-y-z}P$ ($0 \leq y \leq 1$, $0 \leq z \leq 1$).

11. A semiconductor light emitting element as defined in claim 6, wherein the current constricting structure is formed by a layer of $Al_yGa_zIn_{1-y-z}P$ ($0 \leq y \leq 1$, $0 \leq z \leq 1$).

12. A semiconductor light emitting element as defined in claim 11, wherein a current diffusion layer is formed above the layer forming the current constricting structure.

13. A semiconductor light emitting element as defined in claim 12, wherein the current diffusion layer is formed by a layer of $Al_yGa_zIn_{1-y-z}P$ ($0 \leq y \leq 1$, $0 \leq z \leq 1$).

14. A semiconductor light emitting element as defined in claim 11, wherein a current diffusion layer is formed by a layer of $Al_xGa_{1-x}As$ ($0 \leq x \leq 1$).

15. A semiconductor light emitting element as defined in claim 6, wherein a current diffusion layer is formed above the layer forming the current constricting structure.

16. A semiconductor light emitting element as defined in claim 15, wherein the current diffusion layer is formed by a transparent electrode having the transmittance of the emitted light, which transmittance is not less than 50%.

17. A semiconductor light emitting element as defined in claim 15, wherein the current diffusion layer is formed by a layer of $Al_yGa_zIn_{1-y-z}P$ ($0 \leq y \leq 1$, $0 \leq z \leq 1$).

18. A semiconductor light emitting element as defined in claim 15, wherein the current diffusion layer is formed by a layer of $Al_xGa_{1-x}As$ ($0 \leq x \leq 1$).

19. A semiconductor light emitting element as defined in claim 1, wherein the GaAs substrate has a surface inclined at an angle of not less than 2 degrees in the direction [0 1 1] or [0-1-1] from the plane (100).

20. A semiconductor light emitting element, comprising:
   a substrate;
   a light emitting layer; and
   a resonator comprising first and second reflecting films disposed on opposite sides of the light emitting layer, wherein the first reflecting film comprises $Al_xGa_{1-x}As$ ($0 \leq x \leq 1$) and the second reflecting film comprises $Al_yGa_zIn_{1-y-z}P$ ($0 \leq y \leq 1$, $0 \leq z \leq 1$),
   wherein the first reflecting film is disposed on the same side of the light emitting laver as the substrate.

21. A semiconductor light emitting element as defined in claim 20, wherein the light emitting layer comprises one or more films of $Al_yGa_zIn_{1-y-z}P$ ($0 \leq y \leq 1$, $0 \leq z \leq 1$).

22. A semiconductor light emitting element as defined in claim 20, further comprising:
a current constricting layer provided on the side of the light emitting layer opposite the side on which the substrate is provided.

23. A semiconductor light emitting element as defined in claim 22, wherein the current constricting layer comprises an insulating layer.

24. A semiconductor light emitting element as defined in claim 22, wherein the current constricting layer comprises material of the same conductive type as the substrate.

25. A semiconductor light emitting element as defined in claim 22, further comprising:
a current diffusion layer formed on the current constricting layer.

26. A semiconductor light emitting element as defined in claim 25, wherein the current diffusion layer comprises $Al_yGa_zIn_{1-y-z}P$ ($0 \leq y \leq 1$, $0 \leq z \leq 1$).

27. A semiconductor light emitting element as defined in claim 20, wherein the substrate comprises a GaAs substrate having a surface inclined at not less than 2 degrees in the direction [011] or [0-1-1] from the plane (100).

28. A semiconductor light emitting element as defined in claim 20, wherein the resonator has a resonant wavelength of 650 nm.

29. A semiconductor light emitting element as defined in claim 20, wherein the length of the resonator is 1.5 times the resonant wavelength of the resonator.

* * * * *